United States Patent
Inomata

(10) Patent No.: US 7,128,975 B2
(45) Date of Patent: Oct. 31, 2006

(54) MULTICRYSTALLINE SILICON SUBSTRATE AND PROCESS FOR ROUGHENING SURFACE THEREOF

(75) Inventor: Yosuke Inomata, Yokaichi (JP)

(73) Assignee: Kyocera Corporation, Kyoto (JP)

( * ) Notice: Subject to any disclaimer, the term of this patent is extended or adjusted under 35 U.S.C. 154(b) by 171 days.

(21) Appl. No.: 10/762,676

(22) Filed: Jan. 22, 2004

(65) Prior Publication Data

US 2004/0152326 A1   Aug. 5, 2004

(30) Foreign Application Priority Data

Jan. 28, 2003  (JP)  ............................. 2003-019535

(51) Int. Cl.
  *B32B 9/04*    (2006.01)
  *H01L 31/00*   (2006.01)
  *B44C 1/22*    (2006.01)

(52) U.S. Cl. ...................... 428/446; 428/141; 136/256; 136/258; 216/79; 216/99

(58) Field of Classification Search ..................... None
  See application file for complete search history.

(56) References Cited

U.S. PATENT DOCUMENTS

| | | | | |
|---|---|---|---|---|
| 4,229,233 A | * | 10/1980 | Hansen et al. | ................. 438/71 |
| 6,156,968 A | * | 12/2000 | Nishimoto et al. | ......... 136/252 |
| 6,207,890 B1 | * | 3/2001 | Nakai et al. | ................ 136/246 |
| 6,663,944 B1 | * | 12/2003 | Park et al. | ................... 428/156 |

FOREIGN PATENT DOCUMENTS

JP    09-102625    4/1997

* cited by examiner

*Primary Examiner*—Nadine Norton
*Assistant Examiner*—Eric B. Chen
(74) *Attorney, Agent, or Firm*—Hogan & Hartson LLP

(57) ABSTRACT

A surface of a multicrystalline silicon substrate is etched with an alkaline aqueous solution in a condition so that a surface area-to-planar surface area ratio R is smaller than 1.1. A multiplicity of fine textures are formed over the irregularities by dry etching. This allows fine textures to be formed uniformly, and a solar cell with high efficiency can thus be produced.

10 Claims, 6 Drawing Sheets

MULTICRYSTALLINE SILICON SUBSTRATE AND PROCESS FOR ROUGHENING SURFACE THEREOF

This application is based on application No. 2003-019535 filed in Japan, the content of which is incorporated hereinto by reference.

BACKGROUND OF THE INVENTION

1. Field of the Invention

The present invention relates to a multicrystalline silicone substrate and a process for roughening surface thereof, preferably used in a field of solar cell or the like.

2. Description of the Related Art

Solar cell is a device that converts light energy incident on its surface such as sunlight into electric energy. Various approaches have been attempted in order to improve efficiency in converting light energy into electric energy. One of such approaches is technique that reduces reflectance of light incident on the surface of the substrate. Reducing the reflectance of light incident on the surface allows the conversion efficiency into electric energy to be improved.

The main types of solar cells are classified by material used into crystalline silicon solar cells, amorphous silicon solar cells, compound based solar cells and the like. Most of the solar cells that are distributed in the market are crystalline silicon solar cells. The crystalline silicon solar cells are further classified into single crystal type and multicrystalline type. Single crystal silicon solar cells have the advantage that the conversion efficiency is relatively higher because of the high quality of the substrates. However, they have the disadvantage of high production cost of the substrates. In contrast, multicrystalline silicon solar cells have the disadvantage of inferior substrate quality making it difficult to improve conversion efficiency, while they have the advantage of low production cost. In addition, as a result of recent improvement in substrate quality of multicrystalline silicon solar cells and advancement of cell fabrication technology, conversion efficiency on the order of 18% has been achieved at laboratory level for multicrystalline silicon solar cells.

Meanwhile, multicrystalline silicon solar cells at mass-production level have been hitherto on the market because of their low cost. The demand has recently been further increasing under circumstances where environmental issues are of great concern. Accordingly, they are required to have higher conversion efficiency in addition to the low-cost benefit.

In fabricating a solar cell using a silicon substrate, etching a surface of the substrate in a predetermined condition with an alkaline aqueous solution such as a sodium hydroxide solution results in formation of textures on the surface, which reduces reflection of light at the surface to some extent.

When a single crystal silicon substrate with (100) orientation is used, a pyramidal pattern called textured structure can be formed uniformly on the surface of the substrate by such a process.

However, when fabricating a solar cell using a multicrystalline substrate, since texture etching with an alkaline aqueous solution depends on the crystal orientation, such a pyramidal pattern cannot be formed uniformly. For this reason, this poses the problem that the overall reflectance cannot be reduced effectively.

In order to overcome such a problem, preparing a surface having fine textures by means of Reactive Ion Etching has been proposed for the case where a solar cell is fabricated using a multicrystalline silicon substrate (for example, in the patent document [1]). By this method, fine textures can be uniformly formed independent of the irregular orientation of the crystals of multicrystalline silicon. In particular, reflectance can be more effectively reduced in solar cell using multicrystalline silicon.

[1] Japanese Patent Laid-Open Publication No. 1997-102625

Multicrystalline silicon substrates are generally fabricated by slicing a block or ingot of silicon obtained by a casting process. Widely used is slicing with use of an ID blade or multi-wire saw. Silicon substrates fabricated by such a process include a layer that is mechanically damaged by the slicing remaining on the surface, which causes degradation of the solar cell performance. The damaged layer needs to be removed in order to use the substrate for a solar cell. The thickness of the damaged layer is, although it varies depending on the machining process, generally on the order of 10 μm.

However, since the required depth to which the surface is etched by the foregoing reactive ion etching for forming fine textures is several microns at the largest, the damaged layer is hardly removed.

In order to form fine textures on the surface of a substrate for solar cell by reactive ion etching, the damaged layer is preferably removed prior to the formation.

Except for mechanical etching, various processes can be employed for the removal of the damaged layer. Although any of them may be used, in particular, wet etching with chemicals is a simple and easy process. In general, the easiest and inexpensive process is considered to be an etching with use of an alkaline aqueous solution including sodium hydroxide or potassium hydroxide.

However, it has been revealed that removal of the damaged layer by alkaline etching prior to reactive ion etching for forming fine textures sometimes results in formation of too complex irregularities on the substrate, and that the performance of solar cells fabricated using such substrates are degraded.

The object of the present invention is to provide a multicrystalline silicon substrate and a process for roughening a surface thereof that effectively improves the solar cell performance even in a condition of removal of the damaged layer by alkaline etching prior to reactive ion etching for forming fine textures.

A multicrystalline silicon substrate according to the present invention comprises: a substrate of multicrystalline silicon having relatively large irregularities formed on a surface thereof by etching with an alkaline aqueous solution; and a multiplicity of relatively fine textures formed over the relatively large irregularities by dry etching, wherein a ratio r expressed as r=a/b, which is the ratio between the length a of a virtual line connecting individual peaks of the relatively fine textures at a vertical cross section thereof and the length b of a straight line connecting the endpoints of the virtual line, is not smaller than 1 and smaller than 1.1.

This multicrystalline silicon substrate allows fine textures to be formed uniformly with even heights, thereby effectively reducing reflectance in a solar cell fabricated using the substrate. Solar cells with high conversion efficiency can thus be fabricated.

It is preferable that the fine textures have a height and a width of 2 μm or less, respectively. More preferably, the fine textures have a height and a width of 1 μm or less, respectively.

Preferably, the fine textures have a height-to-width aspect ratio of 2 or less. At aspect ratios greater than 2, the fine textures may suffer breakage during the production process causing large leak current to occur in the fabricated solar cell, which therefore fails to have good output performance.

A process for roughening a surface of a solar cell substrate according to the present invention comprises the steps of: etching a surface of a multicrystalline silicon substrate with an alkaline aqueous solution for forming relatively large irregularities having a surface area-to-planar surface area ratio R of larger than 1 and smaller than 1.1; and a dry etching step for forming a multiplicity of relatively fine textures over the relatively large irregularities.

This process allows fine textures to be formed uniformly, thereby effectively reducing reflectance in the solar cell fabricated using the substrate. Solar cells with high conversion efficiency can thus be fabricated.

DETAILED DESCRIPTION OF THE INVENTION

A specific embodiment of the present invention will be hereinafter described in detail with reference to the accompanying drawings taking a bulk crystalline silicon solar cell as an example. However, the present invention is not limited to this example and applicable to solar cells of other types including thin film solar cells using a glass substrate.

Figure 1:
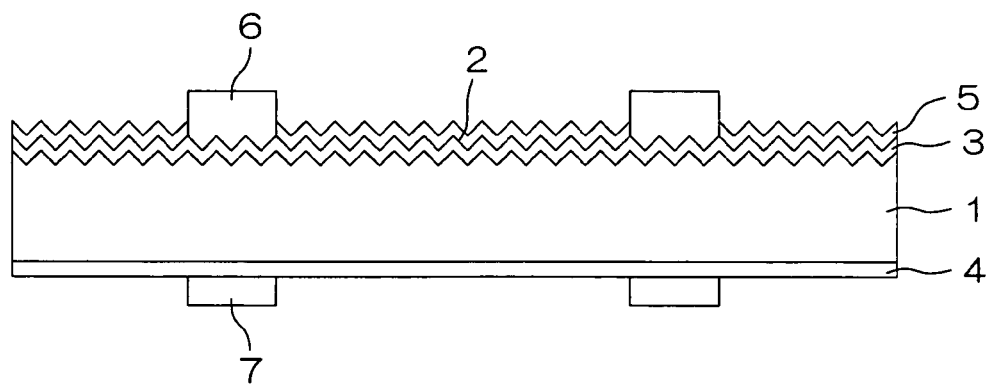
FIG. 1 illustrates a solar cell using a multicrystalline silicon substrate that is surface textured by a process of the present invention.

FIG. 1 is a cross section showing a structure of a solar cell fabricated by a substrate processing method of the invention. Referring to FIG. 1, numeral 1 denotes a silicon substrate, numeral 2 denotes textures formed on the silicon substrate 1, numeral 3 denotes an impurity diffusing layer on the light-reception surface side, numeral 4 denotes an impurity diffusing layer (BSF) on the back surface side of the silicon, numeral 6 denotes a surface electrode, and numeral 7 denotes a back surface electrode.

On the surface side of the silicon substrate 1, impurity diffusing layer 3 in which another type impurity against the substrate is diffused is formed. This impurity diffusing layer 3 is provided for forming a semiconductor junction within the silicon substrate 1. For example, for diffusion of an n-type impurity, a vapor phase diffusion technique using $POCl_3$, spin-on diffusion using $P_2O_5$ or ion implantation for directly introducing $P^+$ ions into the substrate by electric field is used.

The layer 3 including an opposite-type semiconductor impurity is formed to a thickness of 0.3–0.5 μm.

An antireflective film 5 is formed on the surface side of the silicon substrate 1. The antireflective film 5 is provided to prevent light from reflecting at the surface of the silicon substrate 1 so as to effectively introduce light into the silicon substrate 1. As a result of taking into account of the difference in index of refraction between the silicon substrate 1 and the antireflective film and the like, the antireflective film 5 comprises a material having an index of refraction on the order of 2, and is a silicon nitride film or silicon oxide ($SiO_2$) film with a thickness of 500–2000 Å.

Preferably, a layer 4 doped with a same-type semiconductor impurity as that of substrate at a high concentration is formed on the backside surface of the silicon substrate 1. This layer is called Back Surface Field (BSF) layer. The BSF layer 4 doped with a first-type semiconductor impurity at a high concentration is provided to create an internal electric field on the backside of the silicon substrate 1 so as to prevent recombination of carriers in the vicinity of the backside surface of the silicon substrate 1, thereby preventing lowering of the efficiency.

In the above described structure of the solar cell, carriers generated in the vicinity of the back surface of the silicon substrate 1 are accelerated by the electric field, and as a result, electric power can be generated effectively. In particular, photosensitivity to light at long wavelengths is enhanced, so that degradation of the solar cell performance at high temperatures can be alleviated. The sheet resistance on the backside of the silicon substrate 1 formed with the BSF layer 4 is on the order of 15 Ω/sq.

A surface electrode 6 and a back surface electrode 7 are formed on the surface side and backside of the silicon substrate 1, respectively. These surface electrode and back surface electrode are formed by screen printing of Ag paste and thereafter baking Ag paste mainly composed of Ag powder, a binder and frit, and then by forming a solder layer thereon.

The surface electrode 6 is constructed with a large number of fingers (not shown) formed at pitches of about 3 mm across a width of about 200 μm, and two busbars interconnecting the large number of fingers.

The back surface electrode 7 is constructed with a large number of fingers (not shown) formed at pitches of about 5 mm across a width of about 300 μm, and two busbars interconnecting the large number of fingers.

The silicon substrate 1 is a multicrystalline silicon substrate. This substrate 1 may either be of p-type or n-type. The multicrystalline silicon substrate 1 is formed by the casting method or the like. Being mass-producible, multicrystalline silicon is quite advantageous over single crystal silicon in terms of production cost. A silicon substrate is produced by cutting a silicon block formed by a crystal-pulling method or casting method into ingots of 10 cm×10 cm or 15 cm×15 cm in size, and then slicing the ingot into pieces of about 300 μm thickness.

A typical method used for slicing the ingot is sawing with an ID (Inside Diameter) blade or multi-wire saw. Because silicon is sliced by such a mechanical method, residual stress is present on the ground surface, which therefore arises a number of defects in the vicinity of the surface of the silicon substrates. Accordingly, in the manufacture of multicrystalline silicon solar cells, the damaged layer as above needs to be removed since it causes solar cell performance degradation.

In order to remove the damaged layer, a process that causes no additional damage to the surface of the silicon substrate is necessary. Wet etching is generally used as such a process.

The most frequently used process is etching with sodium hydroxide or potassium hydroxide because of the ease and inexpensiveness. The etching with alkaline aqueous solution has a selectivity depending on the crystallographic orientation selectivity preference when etching multicrystalline silicon.

Among the multicrystalline silicon grains, grains of (100) orientation are etched at the fastest etching rate, while grains of (111) orientation are etched at the slowest etching rate. The preference in the etching rate is also effected among individual crystal grains within the multicrystalline silicon substrate so that the etching proceeds to reveal (111) orientation planes ultimately.

As a process for forming irregularities utilizing the foregoing feature, there is a process for forming a textured surface with use of an alkaline aqueous solution. In this process, etching is performed, for example, with a 5% sodium hydroxide aqueous solution at about 70° C. If the crystal grains are of (100) orientation, a myriad of pyramidal structures having four (111) planes are formed on the surfaces of the crystal grains. Accordingly, in cases where a single crystal silicon substrate of (100) orientation is used, pyramidal structures are formed on the whole surface of the single crystal silicon substrate. Where there are the pyramidal structures formed, since they function to reduce reflection of light, the light absorption is increased, thereby improving the solar cell performance. For this reason, silicon substrates of (100) orientation are frequently used for single crystal silicon solar cells.

In the case of a multicrystalline silicon substrate, pyramidal structures are formed on the (100) oriented planes by alkaline etching. While other planes are not formed with pyramidal structures, since the etching proceeds so as to reveal the (111) planes, textures are formed correspondingly. If etched to a depth of about 15 μm with alkaline solution, the sizes of the textures formed by alkaline etching are about several μm to less than 20 μm.

In the present invention, a reactive ion etching (RIE) process is additionally performed after the removal of the damaged layer with an alkaline aqueous solution, so as to form fine textures. This is because it is impossible to remove the damaged layer effectively by RIE process. The RIE process etches only several microns at most when forming fine textures on all the surfaces of the crystal grains of different orientations present on the surface of the multicrystalline silicon substrate.

The RIE process is an etching process, in which gases are introduced into an evacuated chamber, and while the pressure is kept constant, a RF voltage is applied to an electrode situated in the chamber so that a plasma is generated, which yields active species such as ions and radicals that act on the surface of the substrate, thereby etching the surface.

Figure 2:
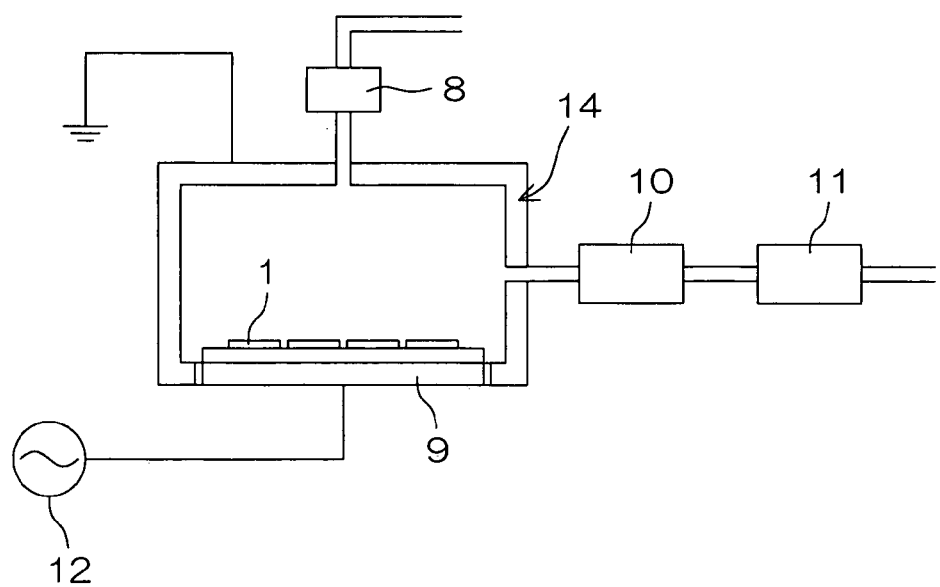
FIG. 2 illustrates a reactive ion etching device used in a process for roughening a surface of a multicrystalline silicon substrate according to the present invention.

This process is generally carried out using a device as shown in FIG. 2.

In FIG. 2, there are shown a mass-flow controller 8, a silicon substrate 1, an RF electrode 9, a pressure regulator 10, a vacuum pump 11, and an RF power source 12. Gases are introduced into the chamber from the mass-flow controller 8. A plasma is generated at the RF electrode so that ions and radicals are excited and activated to act on the surface of the silicon substrate 1 placed above the RF electrode 9, thereby etching the substrate.

In etching processes where active species are produced, the method in which the effect of the ions on the etching is particularly enhanced is generally called reactive ion etching. A process similar to this is plasma etching, where the principle of plasma generation is basically the same. The reactive ion etching differs from the plasma etching only in that the distribution of the active species acting on the substrate is altered to a different one by the arrangement of the chamber, electrode or frequencies generated, and is the same as the plasma etching in other aspects. Accordingly, the present invention applies not only to reactive ion etching, but more widely to plasma etching in general.

In the present invention, for example, with a $Cl_2$ gas flow of 0.01 slm, an $O_2$ gas flow of 0.06 slm and a $SF_6$ gas flow of 0.04 slm, etching is performed under a reaction pressure of 7 Pa and at an RF power of 5 kW for generating plasma for about 5 minutes. By this process, fine textures are formed on a surface of the silicon substrate.

Although silicon is etched and essentially vaporized during the etching, apart thereof is not vaporized and molecules coalesce each other to remain on the surface of the substrate as a residue. The main component of the residue is silicon.

If the conditions of the gases, reaction pressure, RF power and the like are set so that fine textures are formed and the residue as mentioned above remains on the surface of the substrate, fine textures are formed by etching that proceeds utilizing the residue as a mask. Accordingly, textures can be formed reliably. However, as described later, the aspect ratio of the fine textures needs to be optimized by satisfying a specific condition.

Figure 3:
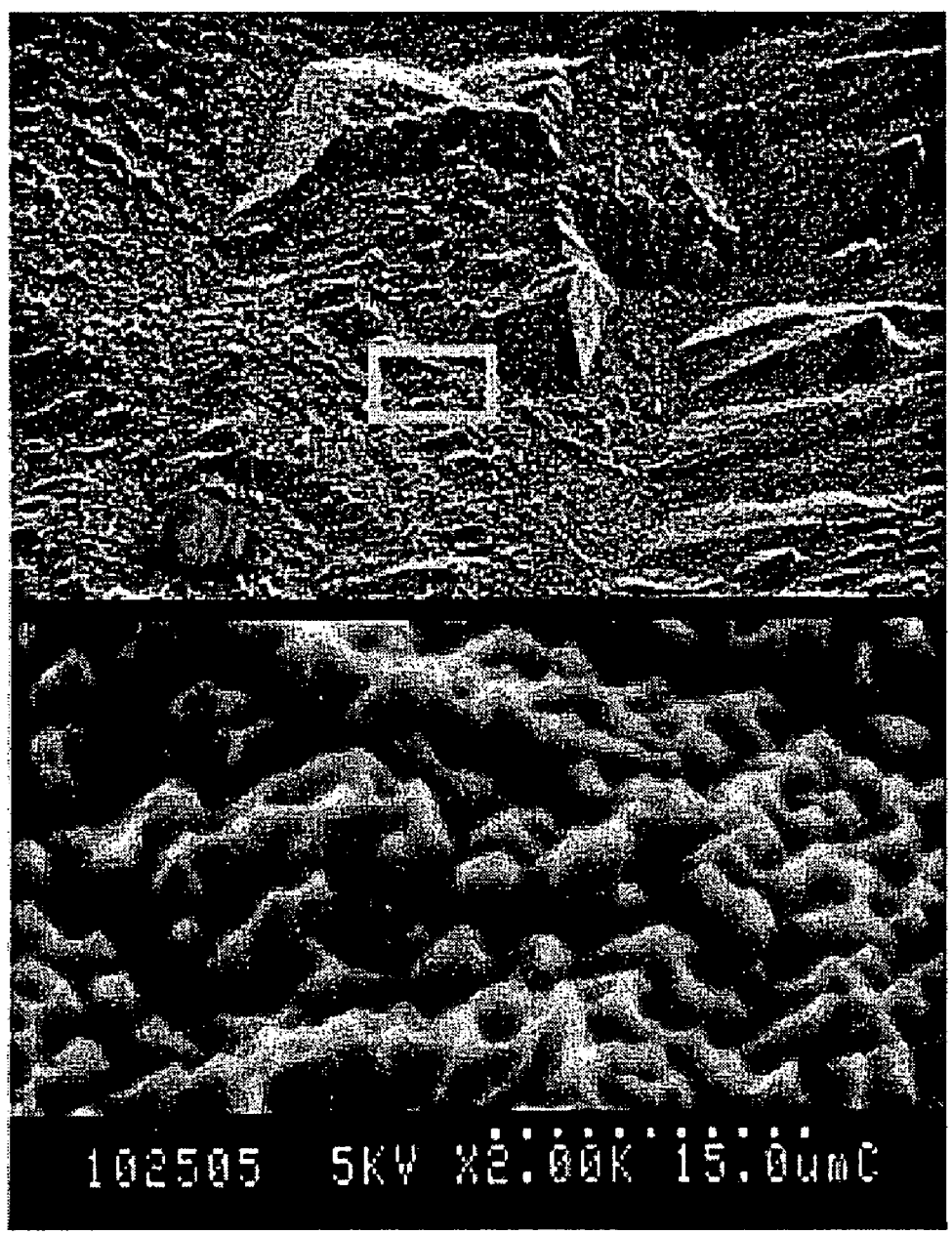
FIG. 3 is a SEM image of a surface of a multicrystalline silicon substrate textured by a surface texturing process of the present invention.

FIG. 3 shows a surface where fine textures are formed by reactive ion etching after removal of damaged layer by etching with an alkaline aqueous solution. The lower photograph of FIG. 3 is enlarged one of the upper photograph.

The sizes of the fine textures formed by reactive ion etching are about 0.1–1.0 μm, which are one order of magnitude smaller than the textures of the texture formed by etching with an alkaline aqueous solution.

In addition, since the formation of textures poorly depends on the crystal orientation in reactive ion etching, a multicrystalline silicon substrate has been texture etched to form uniform fine textures with reactive ion etching after removal of the damaged layer with use of the alkaline aqueous solution.

Figure 4:
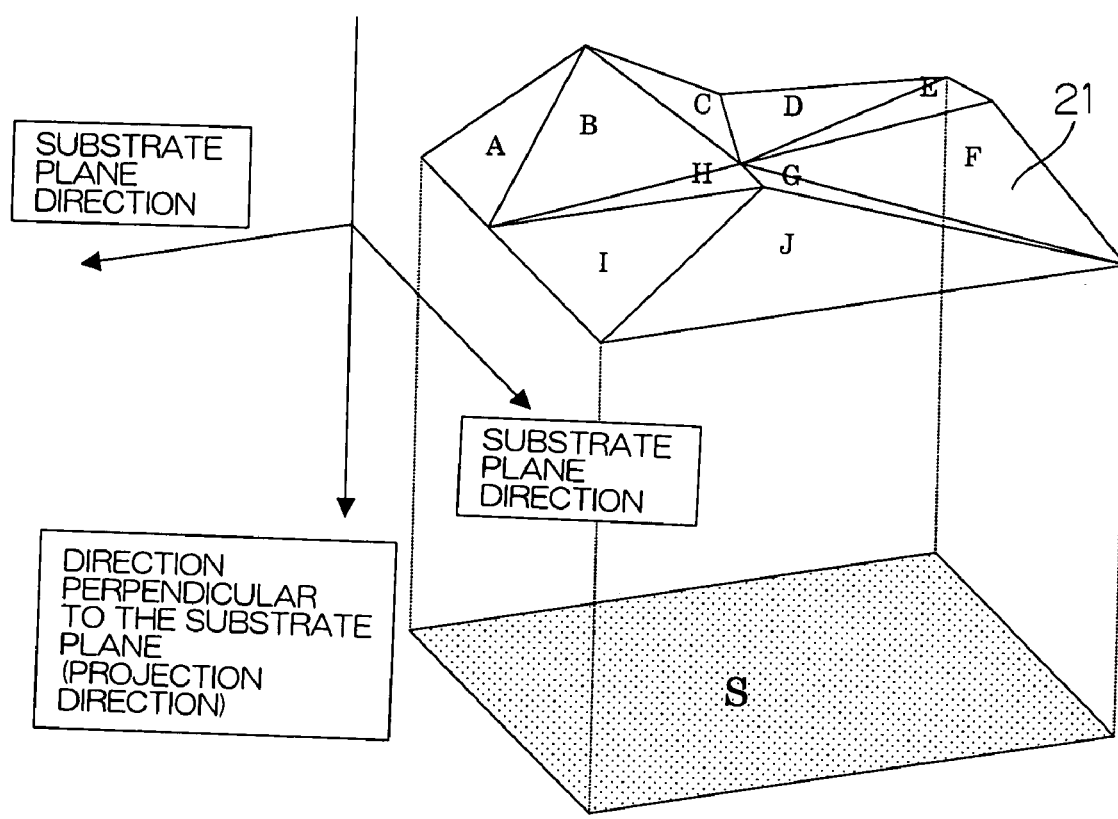
FIG. 4 is a diagram illustrating the definitions of surface area and planar surface area according to the present invention.

FIG. 4 is a schematic diagram showing a random irregularities formed on a surface of a multicrystalline silicon substrate with use of an alkaline aqueous solution. Some irregularities are drawn as a group of small triangles A to J.

In this specification, an area in which the areas of textures of the surface of the silicon substrate are included (in FIG. 4, the sum of the areas of the triangles: A+B+C+D+E+F+G+H+I+J) is referred to as the "surface area", and a projected area that is the area viewed from a direction perpendicular to the silicon substrate (S in FIG. 4) is referred to as the "planar surface area". The surface area can be measured with AFM (Atomic Force Microscope) or SEM (Scanning Electron Microscope) for three-dimensional surface measurements.

Irregularities formed by alkaline etching have surface area-to-planar surface area ratios R of about 1.1 to 1.3. By definition, the ratio R is never smaller than 1.

When fine textures are further formed over the irregularities by reactive ion etching, the surface area formed by etching of irregularities with alkaline aqueous solution further increases. As the surface area increases, difference due to the different crystal orientations becomes prominent. It has been found that, for this reason, when an antireflective film is formed by the CVD method in a later process, color unevenness is caused by the film thicknesses that differ from crystal grain to crystal grain, leading to degradation of the solar cell performance. Also in view of the solar cell performance, a smaller surface area is preferable, because as the surface area increases, saturation current increases leading to an increase in the leakage of the current. In other words, the surface of the silicon substrate before the formation of fine textures by reactive ion etching is preferably as flat as possible.

After a number of experiments, it has been discovered that in order to effectively form fine textures by reactive ion etching after removal of the damaged layer on the surface of a multicrystalline silicon substrate by alkaline etching, it is preferable that the surface area-to-planar surface area ratio R after the removal of the damaged layer by alkaline etching be smaller than 1.1.

By this arrangement, the thickness of the antireflective film can be maintained almost constant irrespective of the crystal grains on the surface of the substrate, so that the performance can be improved sufficiently.

Figure 5:
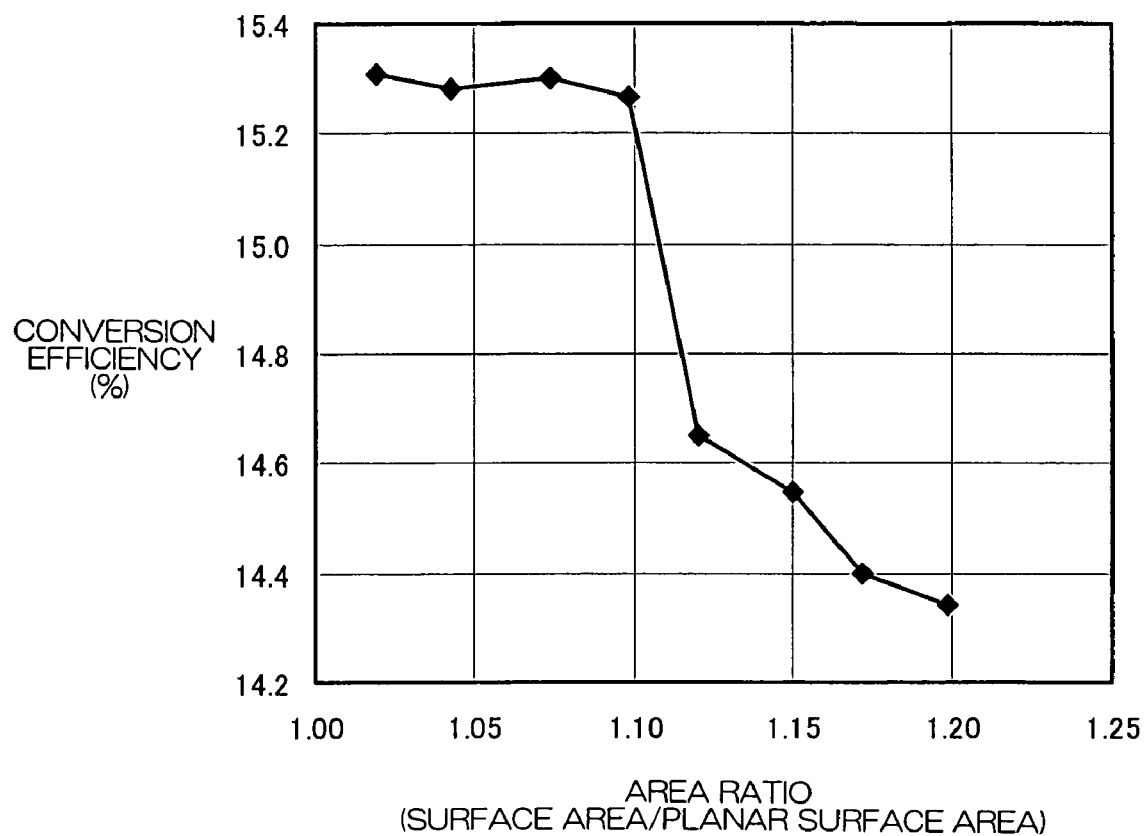
FIG. 5 is a graph showing a relationship between surface area-to-planar surface area ratio R after alkaline etching and conversion efficiency of the fabricated solar cell.

FIG. 5 is a graph showing a relationship between surface area-to-planar surface area ratio R of a substrate after removal of a damaged layer by alkaline etching and conversion efficiency of a solar cell fabricated by forming fine textures by reactive ion etching using the substrate. The graph shows that high conversion efficiencies are achieved when the surface area-to-planar surface area ratio R after removal of the damaged layer by alkaline etching is smaller than 1.1.

Figure 6:
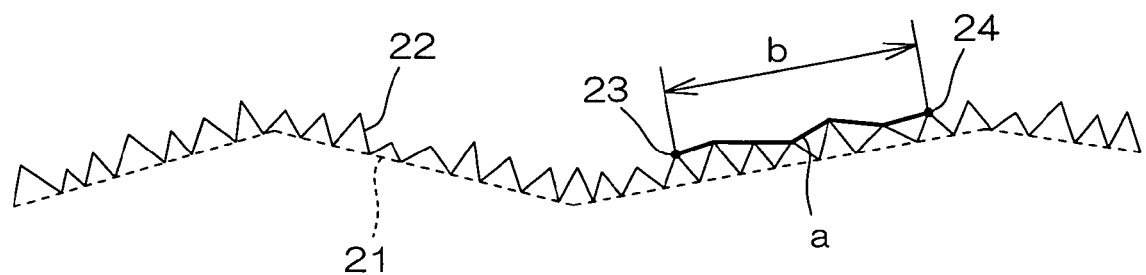
FIG. 6 is a schematic cross-sectional view showing fine textures 22 formed by reactive ion etching over a surface of a silicon substrate 21 after removal of a damaged layer by alkaline etching.

FIG. 6 is a cross-sectional view showing fine textures 22 formed on a surface of a silicon substrate after removal of a damaged layer by alkaline etching.

The present invention is arranged such that ratio r (r=a/b) between the length a of a virtual line (the bold line in FIG. 6) connecting individual peaks of the fine textures 22 at a cross section thereof and the length b of a straight line connecting the two endpoints 23 and 24 of the virtual line is smaller than 1.1, that is r<1.1. This indicates that the heights of the peaks of the fine textures 22 are even. Meanwhile, by definition, the ratio r is never smaller than 1.

In order that the ratio R between the surface area and planar surface area after removal of the damaged layer by alkaline etching is smaller than 1.1, and/or the ratio r between the length a of a virtual line connecting individual peaks of the fine textures 22 at a cross section thereof and the length b of a straight line connecting the two endpoints of the virtual line is smaller than 1.1, performing removal of the damaged layer with the alkaline etching as fast as possible would be effective.

This can be accomplished, for example, by a process in which a 25 wt % sodium hydroxide aqueous solution is heated at 85° C., and a silicon substrate is etched in the solution. In the present invention, the features that ratio R between surface area and planar surface area is smaller than 1.1, and ratio r between the length a of a virtual line connecting individual peaks of the fine textures at a cross section thereof and the length b of a straight line connecting the two endpoints of the virtual line is smaller than 1.1 can be accomplished by performing the alkaline etching at a high speed.

Figure 7:
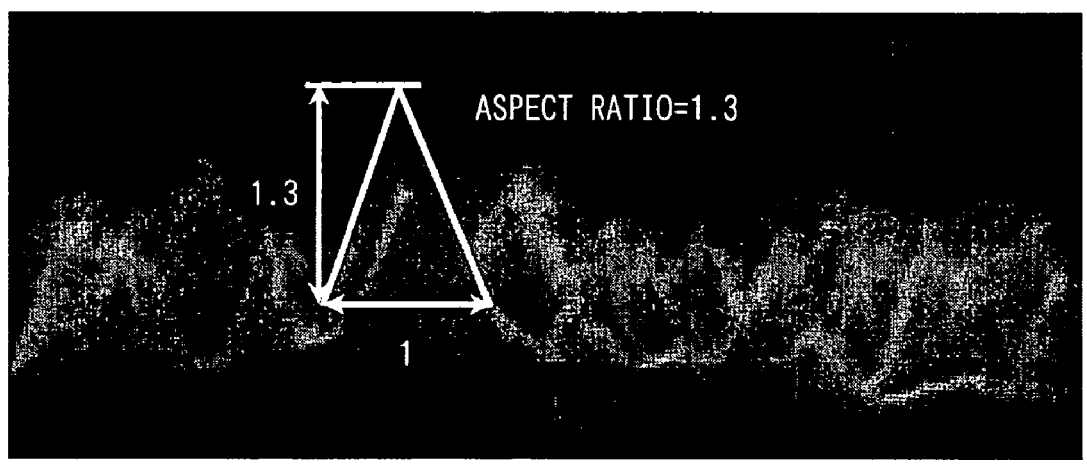
FIG. 7 is an electron microscope image for illustrating aspect ratio in the case of fine textures formed over a surface of a silicon substrate.

As shown in FIGS. 6 and 7, the fine textures form conical shapes or strings of conical shapes. The size thereof can be changed by the gas concentration or etching time in the RIE process.

The fine textures are formed to have a width and a height of 2 μm or less, respectively. In order to controllably form fine textures so as to uniformly and precisely cover all over the required area of the surface of the silicon substrate 1, the width and height are preferably 1 μm or less, respectively.

The aspect ratio used for describing the present invention is defined, as shown in FIG. 7, as the ratio between the height and the base of a triangle that is formed by the generally straight lines of the both sides observed at a cross-section of the fine textures (height/width of an texture). Where the cones of the fine textures form a string, the cross-section of the fine textures mentioned above refers to a vertical cross-section taken along the string.

Since the height and width of the fine texture in FIG. 7 are 1.3 μm and 1 μm, respectively, the aspect ratio is 1.3.

In the present invention, the aspect ratio of the fine textures is preferably 2 or less. When the aspect ratio is greater than 2, breakage of the fine textures occurs in the manufacturing process, and leakage current is great in the fabricated solar cell, which therefore fails to have good output performance.

While a specific embodiment of the present invention has been described so far, implementation of the present invention is not limited to the foregoing embodiment, and various modifications may be made within the scope of the present invention.

The invention claimed is:

1. A multicrystalline silicon substrate comprising:
a substrate of multicrystalline silicon having irregularities formed on a surface thereof; and
a multiplicity of textures formed on the irregularities, wherein the textures are smaller than the irregularities,
wherein a ratio r expressed as r=a/b, which is the ratio between the length a of a virtual line connecting individual peaks of the textures at a vertical cross section thereof and the length b of a straight line connecting the endpoints of the virtual line, is equal to or larger than 1 and smaller than 1.1.

2. The multicrystalline silicon substrate according to claim 1, wherein the fine textures have a height and a width of 2 μm or less, respectively.

3. The multicrystalline silicon substrate according to claim 1, wherein the fine textures have a height and a width of 1 μm or less, respectively.

4. The multicrystalline silicon substrate according to claim 1, wherein the textures have a height-to-width aspect ratio (height/width) of 2 or less.

5. The multicrystalline silicon substrate according to claim 1, wherein the irregularities are formed by etching with an alkaline aqueous solution.

6. The multicrystalline silicon substrate according to claim 1, wherein the textures are formed by dry etching.

7. A multicrystalline silicon substrate comprising:
a substrate of multicrystalline silicon having irregularities formed on a surface thereof; and
a surface area-to-planar surface area ratio R of the substrate being larger than 1 and smaller than 1.1, wherein a multiplicity of textures are formed on the irregularities, and wherein the textures are smaller than the irregularities.

8. The multicrystalline silicon substrate according to claim 7, wherein a ratio r expressed as r=a/b, which is the ratio between the length a of a virtual line connecting individual peaks of the textures at a vertical cross section thereof and the length b of a straight line connecting the endpoints of the virtual line, is equal to or larger than 1 and smaller than 1.1.

9. The multicrystalline silicon substrate according to claim 7, wherein the irregularities are formed by etching with an alkaline aqueous solution.

10. The multicrystalline silicon substrate according to claim 7, wherein the textures are formed by dry etching.

* * * * *